US009029249B2

(12) United States Patent
Ueda et al.

(10) Patent No.: US 9,029,249 B2
(45) Date of Patent: May 12, 2015

(54) PLASMA DOPING APPARATUS AND PLASMA DOPING METHOD

(71) Applicant: Tokyo Electron Limited, Tokyo (JP)

(72) Inventors: Hirokazu Ueda, Miyagi (JP); Masahiro Oka, Miyagi (JP); Masahiro Horigome, Miyagi (JP); Yuuki Kobayashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/136,388

(22) Filed: Dec. 20, 2013

(65) Prior Publication Data

US 2014/0179028 A1 Jun. 26, 2014

(30) Foreign Application Priority Data

Dec. 26, 2012 (JP) .................................. 2012-282859

(51) Int. Cl.
*H01L 21/26* (2006.01)
*H01J 37/32* (2006.01)
*H01J 21/22* (2006.01)

(52) U.S. Cl.
CPC ........... *H01J 37/32192* (2013.01); *H01J 21/22* (2013.01); *H01J 37/3222* (2013.01); *H01J 37/32449* (2013.01); *H01J 37/32972* (2013.01); *H01J 37/3299* (2013.01)

(58) Field of Classification Search
CPC .... H01L 21/22; H01L 21/223; H01L 21/2236
USPC .................................. 438/513, 517, 525, 531
See application file for complete search history.

(56) References Cited

U.S. PATENT DOCUMENTS

| 6,884,664 | B2 * | 4/2005 | Fujimoto et al. | 438/149 |
| 2011/0180213 | A1 * | 7/2011 | Hirayama et al. | 156/345.33 |
| 2013/0302992 | A1 * | 11/2013 | Nozawa et al. | 438/714 |

FOREIGN PATENT DOCUMENTS

| JP | 2002-170782 A | 6/2002 |
| JP | 2004-128209 A | 4/2004 |
| JP | 2008-300687 A | 12/2008 |

* cited by examiner

*Primary Examiner* — Kevin M Picardat
(74) *Attorney, Agent, or Firm* — Rothwell, Figg, Ernst & Manbeck, P.C.

(57) ABSTRACT

Disclosed is a plasma doping apparatus provided with a plasma generating mechanism. The plasma generating mechanism includes a microwave generator that generates microwave for plasma excitation, a dielectric window that transmits the microwave generated by the microwave generator into a processing container, and a radial line slot antenna formed with a plurality of slots. The radial line slot antenna radiates the microwave to the dielectric window. A control unit controls the plasma doping apparatus such that a doping gas and a gas for plasma excitation are supplied into the processing container by a gas supply unit in a state where the substrate is placed on a holding unit, and then plasma is generated by the plasma generating mechanism to perform doping on the substrate such that the concentration of the dopant implanted into the substrate is less than $1\times10^{13}$ atoms/$cm^2$.

16 Claims, 10 Drawing Sheets

PLASMA DOPING APPARATUS AND PLASMA DOPING METHOD

CROSS-REFERENCE TO RELATED APPLICATIONS

This application is based on and claims priority from Japanese Patent Application No. 2012-282859, filed on Dec. 26, 2012, with the Japan Patent Office, the disclosure of which is incorporated herein in its entirety by reference.

TECHNICAL FIELD

The present disclosure relates to a plasma doping apparatus and a plasma doping method.

BACKGROUND

A semiconductor device such as, for example, a large scale integrated circuit (LSI) or a metal oxide semiconductor (MOS) transistor is manufactured by performing a processing such as, for example, doping, etching, chemical vapor deposition (CVD), or sputtering on a semiconductor substrate (wafer) which is a substrate to be processed.

Here, when doping is performed on the substrate, doping at a low concentration may be required. Japanese Patent Application Laid-Open No. 2004-128209 discloses a technology related to doping at a low concentration on the substrate.

In Japanese Patent Application Laid-Open No. 2004-128209, it is described that, in order to perform low concentration doping, it is required to lower a pressure within a vacuum container, and decrease a partial pressure of a doping gas. Further, in Japanese Patent Application Laid-Open No. 2004-128209, it is described that, when helium (He) that does not cause appreciable ion irradiation damage to a sample is used as a dilution gas, an electric discharge is hardly initiated at a low pressure. Japanese Patent Application Laid-Open No. 2004-128209 discloses a plasma doping method for solving these problems. The plasma doping method includes a first step of placing a sample on a sample electrode within a vacuum container, a second step of exhausting the inside of the vacuum container while supplying a gas into the vacuum container and generating plasma within the vacuum container by supplying a high frequency electrode to a plasma source while controlling the pressure inside of the vacuum container to a first pressure, and a third step of controlling the pressure inside of the vacuum container to a second pressure that is lower than the first pressure while the plasma is generated. In Japanese Patent Application Laid-Open No. 2004-128209, helium is used as a dilution gas and inductively-coupled plasma (ICP) is used as a plasma source.

SUMMARY

The present disclosure provides a plasma doping apparatus that performs doping by implanting a dopant into a substrate to be processed. The plasma doping apparatus includes: a processing container configured to implant the dopant into the substrate therein; a gas supply unit configured to supply a doping gas and an inert gas for plasma excitation into the processing container; a holding unit disposed within the processing container and configured to hold the substrate thereon; a plasma generating mechanism configured to generate plasma within the processing container by using microwave; a pressure control mechanism configured to control pressure within the processing container; and a control unit configured to control the plasma doping apparatus. The plasma generating mechanism includes a microwave generator configured to generate microwave for plasma excitation, a dielectric window configured to transmit the microwave generated by the microwave generator into the processing container, and a radial line slot antenna formed with a plurality of slots and configured to radiate the microwave to the dielectric window. The control unit performs a control such that the doping gas and the gas for plasma excitation are supplied into the processing container by the gas supply unit in a state where the substrate is placed on the holding unit, and then the plasma is generated by the plasma generating mechanism to perform the doping on the substrate such that the concentration of the dopant implanted into the substrate is less than $1 \times 10^{13}$ atoms/cm$^2$.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
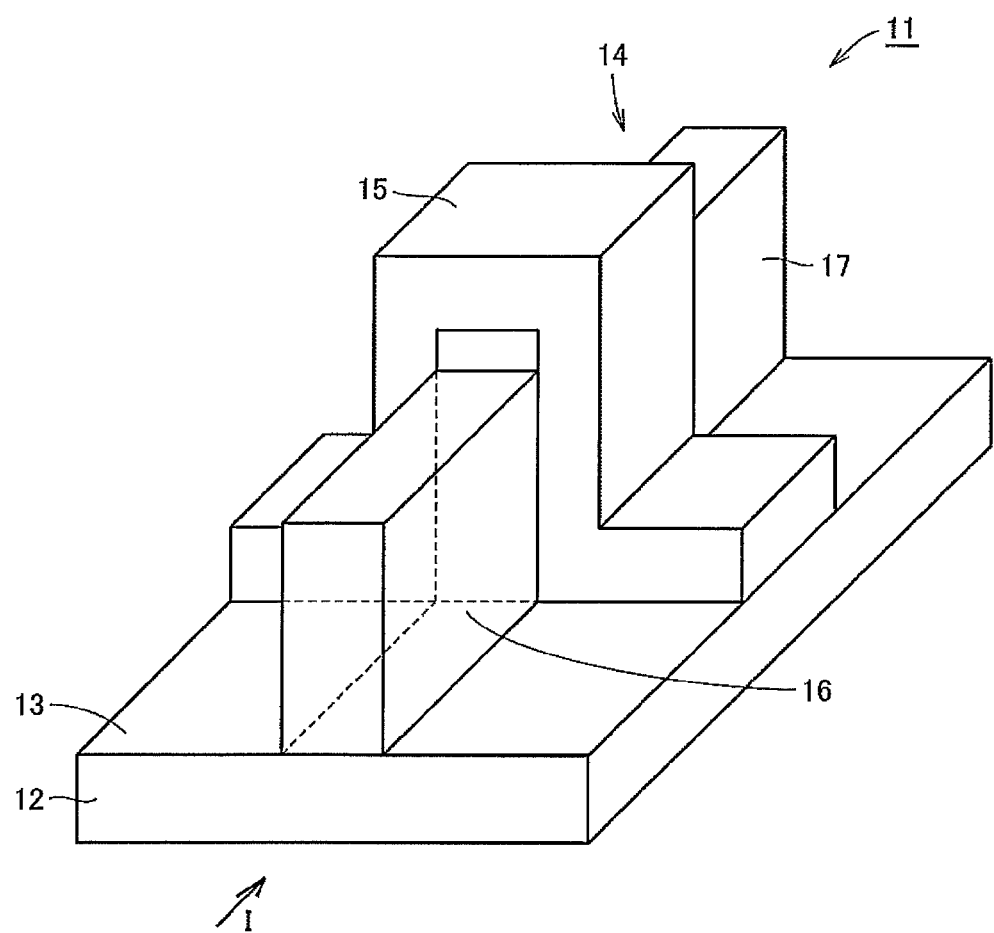
FIG. 1 is a schematic perspective view illustrating a portion of a Fin Field Effect Transistor (FinFET) type semiconductor device which is an example of a semiconductor device manufactured by a plasma doping method and a plasma doping apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

According to Japanese Patent Application Laid-Open No. 2004-128209, when doping is performed by using helium as a dilution gas and by ICP, that is, plasma generated by inductive coupling, a high pressure is developed inside the vacuum container to generate the plasma, and then a doping gas is supplied into a processing container, and a low pressure is developed inside the vacuum container to perform the doping. However, this process may cause following problems.

That is, according to the process disclosed in Japanese Patent Application Laid-Open No. 2004-128209, it takes at least about several seconds until the doping gas supplied after generating plasma by inductive coupling within the vacuum container is uniformly supplied to the inside of the vacuum container. Conversely, in a state where the plasma is generated by inductive coupling, the concentration of the doping gas within the vacuum container is placed in an uneven state for at least several seconds after supplying the doping gas. Even for the several seconds, doping on the substrate to be processed is advanced by the generated ICP. The doping in a state where the concentration of the doping gas is uneven causes in-plane non-uniformity of a dose amount on the substrate. Especially, when doping at a relatively low concentration is performed, a doping time itself is shortened, which causes a tendency of in-plane non-uniformity of doping on the substrate to be further remarkable.

As disclosed in Japanese Patent Application Laid-Open No. 2004-128209, the doping using helium as a dilution gas has a disadvantage in that the electric discharge is hardly initiated at a low pressure. Accordingly, when the doping using helium as a dilution gas is performed, it is required to increase the pressure within the vacuum container at least at the time of initiating the electric discharge. Such doping under a high pressure process condition, specifically, on the premise of initiating the electric discharge at a high pressure is not desirable because the doping is subjected to a restriction in the process. That is, for example, when the pressure of initiating the electric discharge and the pressure for performing doping are required to be changed as described in Japanese Patent Application Laid-Open No. 2004-128209, the process becomes complicated. Further, without alternative in choice of a dilution gas, there is a problem in doping from the standpoint of degree of freedom in a process design.

In Japanese Patent Application Laid-Open No. 2004-128209, doping is performed at a low concentration of about $1.0 \times 10^{13}$ atoms/cm$^2$. However, the dose amount may be required to be further decreased. Specifically, doping at a low concentration of about $1.0 \times 10^{12}$ atoms/cm$^2$ may be required. When such doping at a lower concentration is performed, the above described problems become further remarkable. Thus, it is difficult to cope with the problems in the technology disclosed in Japanese Patent Application Laid-Open No. 2004-128209.

According to an aspect of the present disclosure, a plasma doping apparatus performs doping by implanting a dopant into a substrate to be processed. The plasma doping apparatus includes: a processing container configured to implant the dopant into the substrate therein; a gas supply unit configured to supply a doping gas and an inert gas for plasma excitation into the processing container; a holding unit disposed within the processing container and configured to hold the substrate thereon; a plasma generating mechanism configured to generate plasma within the processing container by using microwave; a pressure control mechanism configured to control pressure within the processing container; and a control unit configured to control the plasma doping apparatus. The plasma generating mechanism includes a microwave generator configured to generate microwave for plasma excitation, a dielectric window configured to transmit the microwave generated by the microwave generator into the processing container, and a radial line slot antenna formed with a plurality of slots and configured to radiate the microwave to the dielectric window. The control unit performs a control such that the doping gas and the gas for plasma excitation are supplied into the processing container by the gas supply unit in a state where the substrate is placed on the holding unit, and then the plasma is generated by the plasma generating mechanism to perform the doping on the substrate such that the concentration of the dopant implanted into the substrate is less than $1 \times 10^{13}$ atoms/cm$^2$.

In the configuration as described above, the plasma is generated by the microwave using the radial line slot antenna when doping at a low concentration is performed in which the concentration of the dopant implanted into the substrate is less than $1 \times 10^{13}$ atoms/cm$^2$. Thus, the doping may be performed under the condition of a low electron temperature and a high electron density. Therefore, plasma damage to the substrate may be reduced in the doping and the doping at a low concentration may be efficiently performed. Since the plasma may be generated over a wide pressure condition from a low pressure to a high pressure by microwave using the radial line slot antenna, there is no need particularly to stick to the kind of the dilution gas or the gas for plasma excitation. Further, since the plasma may be generated, and then doping may be performed while the doping gas is supplied into the processing container, the doping gas may be supplied into the processing container before the plasma is generated, and the doping may be performed in a state where the doping gas is uniformly supplied into the processing container. This may increase the in-plane uniformity of a dose amount on the substrate. Accordingly, the plasma doping apparatus may perform stable doping on the substrate, and improve in-plane uniformity of a dose amount on the substrate.

The plasma doping apparatus may further include a dose amount measuring mechanism configured to measure a dose amount of the dopant implanted into the substrate. The control unit may be configured to perform a control such that the doping on the substrate is stopped when the dose amount measuring mechanism determines that the dose amount of the dopant implanted into the substrate has reached a required amount.

The dose amount measuring mechanism may be configured to include a luminous intensity measuring apparatus configured to measure a luminous intensity of an element within the processing container, and to determine that the dose amount of the dopant has reached the required amount based on the luminous intensity of the element within the processing container which is measured by the luminous intensity measuring apparatus.

According to another aspect of the present disclosure, a plasma doping apparatus performs doping by implanting a dopant into a substrate to be processed. The plasma doping apparatus includes: a processing container configured to implant the dopant into the substrate therein; a gas supply unit configured to supply a doping gas and an inert gas for plasma excitation into the processing container; a holding unit disposed within the processing container and configured to hold the substrate thereon; a plasma generating mechanism configured to generate plasma within the processing container by using microwave; a pressure control mechanism configured to control pressure within the processing container; a dose amount measuring mechanism configured to measure a dose amount of the dopant implanted into the substrate; and a control unit configured to control the plasma doping apparatus. The plasma generating mechanism includes a microwave generator configured to generate microwave for plasma excitation, a dielectric window configured to transmit the microwave generated by the microwave generator into the processing container, and a radial line slot antenna formed with a plurality of slots and configured to radiate the microwave to the dielectric window. The control unit performs a control such that he doping gas and the gas for plasma excitation are supplied into the processing container by the gas supply unit in a state where the substrate is placed on the holding unit, then the plasma is generated by the plasma generating mechanism to perform doping on the substrate, and the doping is stopped when the dose amount measured by the dose amount measuring mechanism has reached a predetermined value.

The dose amount measuring mechanism may be configured to include a luminous intensity measuring apparatus configured to measure a luminous intensity of an element within the processing container.

The control unit may be configured to control the pressure control mechanism such that the pressure within the processing container is set to be in a range of 100 mTorr to 150 mTorr so as to perform the doping.

The gas for plasma excitation may include at least one of He and Ar.

The doping gas may include at least one of $B_2H_6$ and $BF_3$.

According to a further aspect of the present disclosure, a plasma doping method performs doping by implanting a dopant into a substrate to be processed. The method includes: holding the substrate on a holding unit disposed within a processing container; supplying a doping gas and a gas for plasma excitation into the processing container; and performing doping on the substrate such that the concentration of the dopant implanted into the substrate is less than $1\times10^{13}$ atoms/ $cm^2$ by generating plasma within the processing container by using a microwave generator, a dielectric window and a radial line slot antenna. The microwave generator is configured to generate microwave for plasma excitation within the processing container, the dielectric window is configured to transmit the microwave generated by the microwave generator into the processing container, and the radial line slot antenna is formed with a plurality of slots and configured to radiate the microwave to the dielectric window.

The method may further include stopping the doping on the substrate when it is determined that a dose amount of the dopant implanted into the substrate has reached a required amount at the time of measuring the dose amount of the dopant implanted into the substrate.

In the stopping, a luminous intensity of an element within the processing container may be measured, and it may be determined that the dose amount of the dopant has reached the required amount based on the measured luminous intensity of the element within the processing container.

According to a still further aspect of the present disclosure, a plasma doping method performs doping by implanting a dopant into a substrate to be processed. The method includes: holding the substrate on a holding unit disposed within a processing container; supplying a doping gas and a gas for plasma excitation into the processing container; performing doping on the substrate by generating plasma within the processing container by using a microwave generator, a dielectric window and a radial line slot antenna; and measuring a dose amount of the dopant implanted into the substrate by the doping. The microwave generator is configured to generate microwave for plasma excitation within the processing container, the dielectric window is configured to transmit the microwave generated by the microwave generator into the processing container, and the radial line slot antenna is formed with a plurality of slots and configured to radiate the microwave to the dielectric window.

When measuring the dose amount, the dose amount may be measured based on a measured luminous intensity of an element within the processing container.

The doping may be performed while the pressure within the processing container is set to be in a range of 100 mTorr to 150 mTorr.

The gas for plasma excitation may include at least one of He and Ar.

The doping gas may include at least one of $B_2H_6$ and $BF_3$.

With the above described configuration, the plasma doping apparatus may perform stable doping on the substrate, and improve in-plane uniformity of a dose amount on the substrate.

Hereinafter, exemplary embodiments of the present disclosure will be described with reference to drawings. First, the configuration of a semiconductor device manufactured by a plasma doping method and a plasma doping apparatus according to an exemplary embodiment of the present disclosure will be simply described.

FIG. 1 is a schematic perspective view illustrating a portion of a FinFET type semiconductor device which is an example of a semiconductor device manufactured by a plasma doping method and a plasma doping apparatus according to an exemplary embodiment of the present disclosure. Referring to FIG. 1, a FinFET-type semiconductor device 11, which is manufactured by the plasma doping method and the plasma doping apparatus according to an exemplary embodiment of the present disclosure, is formed with a fin 14 that protrudes upwardly by a predetermined length from a main surface 13 of a silicon substrate 12. The extension direction of the fin 14 is indicated by arrow I in FIG. 1. The fin 14 portion in the FinFET-type semiconductor device 11 is substantially rectangular when viewed in the direction of arrow I which is the horizontal direction of the FinFET-type semiconductor device 11. A gate 15 that extends in a direction perpendicular to the extension direction of the fin 14 is formed to cover a portion of the fin 14. A source 16 is formed at the front side of the formed gate 15 in the fin 14, and a drain 17 is formed at the back side of the gate 15. Doping is performed by plasma generated by using microwave on such a shape of the fin 14, that is, the surface of a portion protruding upwardly from the main surface 13 of the silicon substrate 12.

Although not illustrated in FIG. 1, in some semiconductor device manufacturing processes, photoresist layers may be formed in a step before the plasma doping is performed. The photoresist layers are formed at a predetermined interval at the lateral sides of the fin 14, for example, at portions located at the left and right sides in the paper sheet in FIG. 1. The photoresist layers extend in the same direction as the fin 14 and are formed to extend upwardly by a predetermined length from the main surface 13 of the silicon substrate 12.

Figure 2:
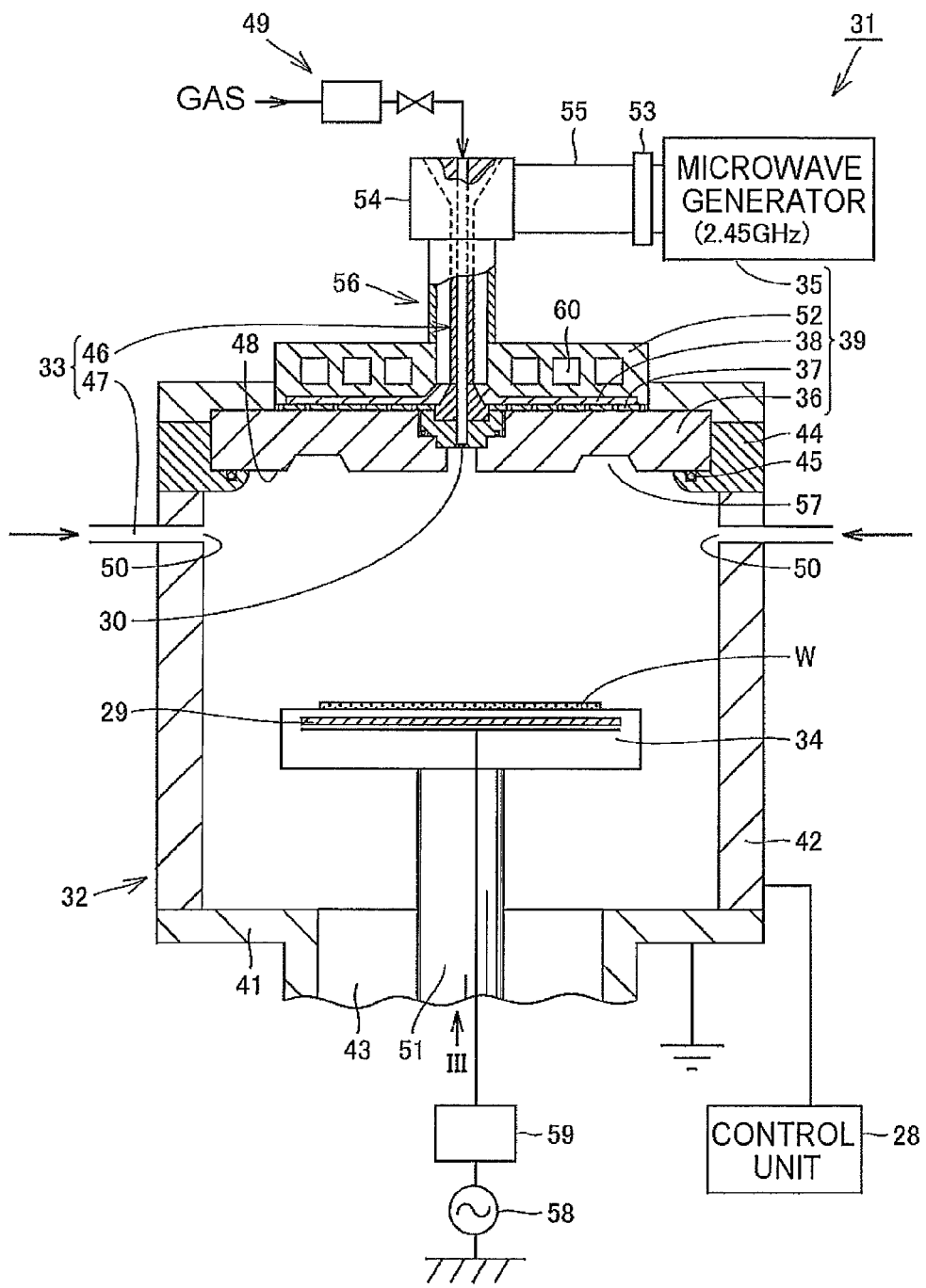
FIG. 2 is a schematic cross-sectional view illustrating a main part of the plasma doping apparatus according to an exemplary embodiment of the present disclosure.
Figure 3:
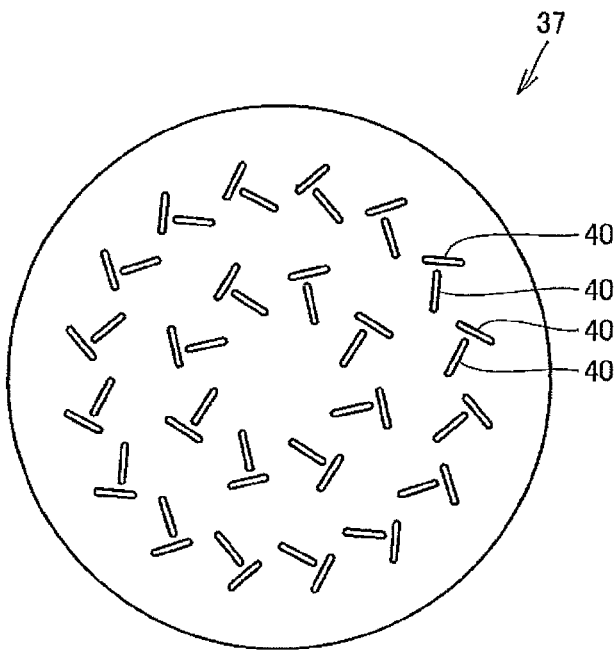
FIG. 3 is a schematic view illustrating a slot antenna included in the plasma doping apparatus illustrated in FIG. 2 when viewed in the direction of arrow III in FIG. 2.

FIG. 2 is a schematic cross-sectional view illustrating a main part of the plasma doping apparatus according to an exemplary embodiment of the present disclosure. FIG. 3 is a view illustrating a slot antenna included in the plasma doping apparatus illustrated in FIG. 2 when viewed from the bottom side, that is, in the direction of arrow III in FIG. 2. In FIG. 2, hatching of some members is omitted for an easy understanding. In this exemplary embodiment, the vertical direction in the paper sheet in FIG. 2 is considered as the vertical direction of the plasma doping apparatus.

Referring to FIGS. 2 and 3, a plasma doping apparatus 31 is provided with a processing container 32 configured to perform plasma doping on a substrate W therein, a gas supply unit 33 configured to supply a gas for plasma excitation or a doping gas into the processing container 32, a disk-shaped holding unit 34 configured to hold the substrate W thereon, a plasma generating mechanism 39 configured to generate plasma within the processing container 32 by using microwave, a pressure control mechanism configured to control the pressure within the processing container 32, a bias power supply mechanism configured to supply an AC bias power to the holding unit 34, and a control unit 28 configured to control the entire operation of the plasma doping apparatus 31. The control unit 28 performs the entire control of the plasma doping apparatus 31, for example, the control of a gas flow rate in the gas supply unit 33, a pressure within the processing container 32, and a bias power to be supplied to the holding unit 34.

The processing container 32 includes a bottom section 41 positioned below the holding unit 34, and a side wall 42 extending upwardly from the outer circumference of the bottom section 41. The side wall 42 has a substantially cylindrical shape. An exhausting hole 43 for exhausting a gas is formed at the bottom section 41 of the processing container 32 to extend through a portion of the bottom section 41. The top side of the processing container 32 is opened, and the processing container 32 is configured to be capable of being sealed by a cover unit 44 disposed on the top of the processing container 32, a dielectric window 36 to be described later, and an O ring 45 as a sealing member interposed between the dielectric window 36 and the cover unit 44.

The gas supply unit 33 includes a first gas supply unit 46 configured to eject a gas toward the center of the substrate W, and a second gas supply unit 47 configured to eject a gas from the outside of the substrate W. A gas supply hole 30 configured to supply the gas from the first gas supply unit 46 is formed at the center of the dielectric window 36 in a diametrical direction, that is, a position retracted inwardly into the dielectric window 36 from the bottom surface 48 of the dielectric window 36. Here, the bottom surface 48 faces the holding unit 34. The first gas supply unit 46 supplies an inert gas for plasma excitation or a doping gas while controlling, for example, a flow rate, through a gas supply system 49 connected to the first gas supply unit 46. The second gas supply unit 47 is formed by forming a plurality of gas supply holes 50 at the upper portion of the side wall 42. The plurality of gas supply holes 50 are configured to supply an inert gas for plasma excitation or a doping gas into the processing container 32. The plurality of gas supply holes 50 are formed at equal intervals in the circumferential direction. The first gas supply unit 46 and the second gas supply unit 47 are supplied with the same kind of inert gas for plasma excitation or the same kind of doping gas from a common gas supply source. Also, according to a demand or a control specification, different gases may be supplied from the first gas supply unit 46 and the second gas supply unit 47, and, for example, the flow rate ratio thereof may be adjusted. In the following description, the gas supplied from the first gas supply unit 46 may be referred as a center gas, and the gas supplied from the second gas supply unit 47 may be referred to as an edge gas.

In the holding unit 34, a high frequency power source 58 for RF (radio frequency) bias is electrically connected to an electrode within the holding unit 34 via a matching unit 59. The high frequency power source 58 is capable of outputting a predetermined power (bias power) of high frequency of, for example, 13.56 MHz. The matching unit 59 accommodates a matching device configured to match the impedance at the high frequency power source 58 side with the impedance at the load side mainly such as, for example, the electrode, the plasma, and the processing container 32, and a blocking condenser configured to generate self bias is included in the matching device. Also, at the time of plasma doping, the supply of a bias voltage to the holding unit 34 is appropriately varied as desired. The control unit 28 as the bias power supply mechanism controls the AC bias power to be supplied to the holding unit 34.

The holding unit 34 may hold the substrate W thereon by an electrostatic chuck (not illustrated). The holding unit 34 may be provided with, for example, a heater (not illustrated) for heating, and a required temperature may be set by a temperature control mechanism 29 provided in the inside of the holding unit 34. The holding unit 34 is supported by an insulative cylindrical support 51 that extends vertically upwardly from the lower side of the bottom section 41. The exhausting hole 43 is formed to extend through a portion of the bottom section 41 of the processing container 32 along the outer circumference of the cylindrical support 51. An exhaust device (not illustrated) is connected at the lower side of the exhausting hole 43 formed in a ring shape via an exhaust tube (not illustrated). The exhaust device includes a vacuum pump such as, for example, a turbo molecular pump. The inside of the processing container 32 may be decompressed to a predetermined pressure by the exhaust device. The control unit 28 as a pressure control mechanism controls the pressure within the processing container 32 through, for example, the control of exhaustion by the exhaust device.

The plasma generating mechanism 39 includes a microwave generator 35 which is provided outside of the processing container 32 and configured to generate microwave for plasma excitation. The plasma generating mechanism 39 includes the dielectric window 36 which is disposed at a position facing the holding unit 34, and introduces the microwave generated by the microwave generator 35 into the processing container 32. The plasma generating mechanism 39 includes a slot antenna 37 which is formed with a plurality of slots and disposed on the top side of the dielectric window 36. The slot antenna 37 is configured to radiate the microwave to the dielectric window 36. The plasma generating mechanism 39 may include a dielectric member 38 which is disposed on the top of the slot antenna 37 and configured to radially propagate the microwave introduced from a coaxial waveguide 56 to be described later.

The microwave generator 35 having a matching unit 53 is connected to the top of the coaxial waveguide 56 configured to introduce the microwave, via a mode converter 54 and a waveguide 55. For example, a TE-mode microwave generated by the microwave generator 35 passes through the waveguide 55, is converted into a TEM-mode microwave by the mode converter 54, and propagates through the coaxial waveguide 56. As the frequency of the microwave generated by the microwave generator 35, for example, 2.45 GHz is selected.

The dielectric window 36 has a substantially disk shape and is formed of a dielectric material. A ring-shaped recess 57 which is recessed in a tapered shape is provided at a portion of the bottom surface 48 of the dielectric window 36, so as to ensure that a standing wave may be easily generated by the introduced microwave. Plasma by microwave may be efficiently generated at the bottom side of the dielectric window 36 by the recess 57. A specific material for the dielectric window 36 may be, for example, quartz or alumina.

The slot antenna 37 is formed in a thin disk shape. The plurality of slots 40, as illustrated in FIG. 3, are formed so that two slots 40 are paired to be perpendicular to each other and spaced apart from each other at a predetermined interval. The paired slots 40 are formed in the circumferential direction in a predetermined interval. The plurality of pairs of slots 40 are formed at a predetermined interval in the radial direction.

The microwave generated by the microwave generator 35 is propagated through the coaxial waveguide 56. The microwave radially spreads from a region interposed between the slot antenna 37 and a cooling jacket 52 to the outside in the radial direction and then is radiated from the plurality of slots 40 formed in the slot antenna 37 to the dielectric window 36. The cooling jacket 52 has a circulation path 60 configured to circulate a coolant therein to control the temperature of, for example, the dielectric member 38. The microwave, which has transmitted through the dielectric window 36, generates an electric field just below the dielectric window 36, and generates the plasma within the processing container 32.

When the microwave plasma is generated in the plasma doping apparatus 31, a so-called plasma generating region is formed just below the bottom surface 48 of the dielectric window 36, specifically, at a region positioned about several centimeters below the bottom surface 48 of the dielectric window 36. Then, at a region positioned vertically below the plasma generating region, a so-called plasma diffusion region is formed in which the plasma generated in the plasma generating region is diffused.

Figure 4:
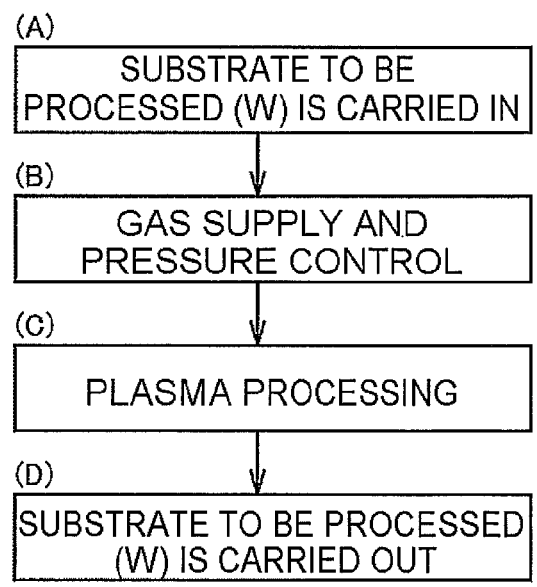
FIG. 4 is a flow chart illustrating a schematic process of the plasma doping method according to an exemplary embodiment of the present disclosure.

Hereinafter, a method of performing plasma doping on the substrate W by using such a plasma doping apparatus will be described. FIG. 4 is a flow chart illustrating a schematic process of the plasma doping method according to an exemplary embodiment of the present disclosure.

Referring to FIG. 4, first, the substrate W is carried into the processing container 32 ((A) in FIG. 4), and held on the holding unit 34. As for the substrate W, a silicon substrate with a diameter of 300 mm is used. Then, a doping gas and a gas for plasma excitation are supplied together into the processing container 32 by the gas supply unit 33, and the pressure within the processing container 32 is controlled to be a required pressure through the control of the pressure control mechanism by the control unit 28 [FIG. 4(B)]. Then, power is applied to the microwave generator 35 to generate microwave plasma, and plasma doping processing is performed [FIG. 4(C)]. Then, doping is performed until a dose amount reaches a required dose amount, specifically a dose amount where the concentration of dopant implanted into the substrate W reaches a predetermined concentration less than $1\times10^{13}$ atoms/cm$^2$, and then, plasma generation is stopped, and the substrate W is carried out from the processing container 32 [FIG. 4(D)]. In this manner, the doping processing on the substrate W is performed through microwave plasma by using a radial line slot antenna.

As a specific process condition, the pressure within the processing container 32 is controlled to be in a range of 100 mTorr to 150 mTorr, for example, 150 mTorr. As the doping gas, a mixed gas of hydrogen ($H_2$) and diborane ($B_2H_6$) is used, in which the ratio of $B_2H_6$ in the mixed gas is 0.7% of $H_2$. The mixed gas and argon (Ar) gas as the gas for plasma excitation are supplied into the processing container 32 by the gas supply unit 33 in a flow rate ratio of mixed gas: Ar gas=1 sccm: 1999 sccm. In this case, the flow rate ratio of boron B in the whole of the gases is 0.7%/2000=0.00035%. As for the power to be applied to the microwave generator 35, a 3 kW (3000 W) power is employed. In this case, boron B is implanted by doping.

In this manner, plasma doping is performed on the substrate W. That is, the plasma doping apparatus 31 according to an exemplary embodiment of the present disclosure is provided with the processing container 32 configured to implant dopant into the substrate W therein, the gas supply unit 33 configured to supply a doping gas and an inert gas for plasma excitation into the processing container 32, the holding unit 34 which is disposed within the processing container 32 and configured to hold the substrate W thereon, the plasma generating mechanism 39 configured to generate plasma within the processing container 32 by using microwave, the pressure control mechanism configured to control the pressure within the processing container 32, and the control unit 28 configured to control the plasma doping apparatus 31. The plasma generating mechanism 39 includes the microwave generator 35 configured to generate microwave for plasma excitation, the dielectric window 36 configured to transmit the microwave generated by the microwave generator 35 into the processing container 32, and the radial line slot antenna 37 which is formed with the plurality of slots 40 and configured to radiate the microwave to the dielectric window 36. The control unit 28 performs a control such that the doping gas and the gas for plasma excitation are supplied into processing container 32 by the gas supply unit 33 in a state where the substrate W is placed on the holding unit 34, and then plasma is generated by the plasma generating mechanism 39 to perform doping on the substrate W, in which the concentration of dopant implanted into the substrate W is less than $1\times10^{13}$ atoms/cm$^2$.

The plasma doping method according to an exemplary embodiment of the present disclosure includes a step of holding the substrate W on the holding unit 34 disposed within the processing container 32, a gas supply step of supplying a doping gas and a gas for plasma excitation into the processing container 32, and a doping step of generating plasma within the processing container 32 by using the microwave generator 35, the dielectric window 36 and the radial line slot antenna 37, to perform doping on the substrate W such that the concentration of the dopant implanted into the substrate W is less than $1\times10^{13}$ atoms/cm$^2$, in which the microwave generator 35 is configured to generate microwave for plasma excitation within the processing container 32, the dielectric window 36 is configured to transmit the microwave generated by the microwave generator 35 into the processing container 32, and the radial line slot antenna 37 is formed with the plurality of slots 40 and configured to radiate the microwave to the dielectric window 36.

With the above described configuration, the plasma is generated by the microwave using the radial line slot antenna 37 when doping at a low concentration is performed in which the concentration of dopant implanted into the substrate W is less than $1 \times 10^{13}$ atoms/cm$^2$. Thus, the doping may be performed under the condition of a low electron temperature and a high electron density. Then, plasma damage to the substrate W may be reduced in the doping, and the doping at a low concentration may be efficiently performed. Since the plasma may be generated under an environment of a wide pressure range from a low pressure to a high pressure by microwave using the radial line slot antenna 37, there is no need particularly to stick to the kind of the dilution gas or the gas for plasma excitation. Further, the doping may be performed after the plasma is generated in a state where the doping gas is supplied into the processing container 32. In such a case, since the doping gas may be supplied into the processing container 32 before generation of the plasma and the doping may be performed in a state where the doping gas is uniformly supplied into the processing container 32, the in-plane uniformity of a dose amount on the substrate W may be improved. Accordingly, the plasma doping apparatus 31 and the plasma doping method may perform stable doping on the substrate W, and improve in-plane uniformity of a dose amount on the substrate W.

Figure 5:
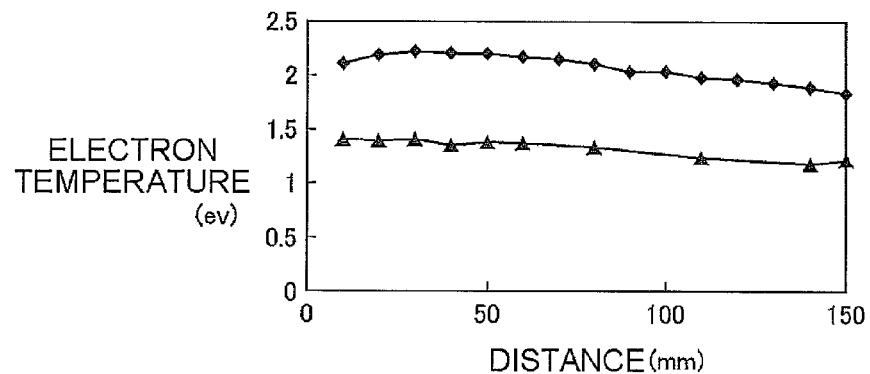
FIG. 5 is a graph representing a relationship between an electron temperature and a downward distance from a bottom surface of a dielectric window in a case where microwave plasma is generated by using a radial line slot antenna, and in a case where plasma is generated by inductive coupling.
Figure 6:
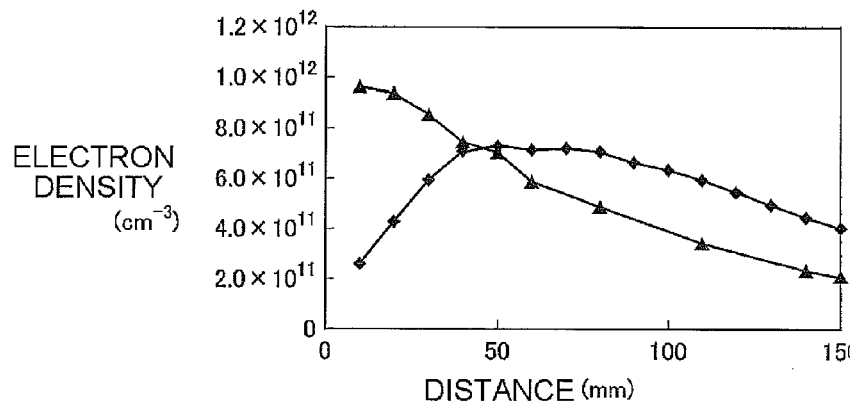
FIG. 6 is a graph representing a relationship between an electron density and a downward distance from a bottom surface of a dielectric window in a case where microwave plasma is generated by using a radial line slot antenna, and in a case where plasma is generated by inductive coupling.

Descriptions on this will be made. FIG. 5 is a graph representing a relationship between an electron temperature and a downward distance from the bottom surface of the dielectric window in a case where microwave plasma is generated by using the radial line slot antenna, and in a case where plasma is generated by inductive coupling. In FIG. 5, the vertical axis represents an electron temperature (eV), and the horizontal axis represents a downward distance (mm) from the bottom surface of the dielectric window. FIG. 6 is a graph representing a relationship between an electron density (cm$^{-3}$) and a downward distance from the bottom surface of the dielectric window in a case where microwave plasma is generated by using the radial line slot antenna, and in a case where plasma is generated by inductive coupling. In FIG. 6, the vertical axis represents an electron density (cm$^{-3}$), and the horizontal axis represents a downward distance (mm) from the bottom surface of the dielectric window. At the time of measuring the electron density of plasma and the electron temperature of plasma, a Langmuir Probe method is used. In this case, the process conditions include a gas flow rate of Ar/N$_2$=400/40 sccm, and a pressure of 90 mTorr. The power to be supplied is 1500 W in the case of the ICP, and 2000 W in the case of the microwave plasma generated by using the radial line slot antenna. In FIG. 5 and FIG. 6, and FIGS. 7 and 8 to be described later, black lozenges indicate the case of plasma generated by inductive coupling, and black triangles and black squares indicate the case of microwave plasma generated by using the radial line slot antenna.

Referring to FIGS. 5 and 6, the plasma generated by inductive coupling has an electron temperature of about 2.0 eV or more with little change according to the distance from the bottom surface of the dielectric window in the measurement range in FIG. 5. Such an electron temperature is relatively high, and may cause damage to the substrate at the time of plasma processing. In contrast, the microwave plasma generated by using the radial line slot antenna has an electron temperature of about 1.5 eV with little change according to the distance from the bottom surface of the dielectric window in the measurement range in FIG. 5. At such a so-called low electron temperature, a plasma processing may be performed without damage to the substrate. That is, in the case of the microwave plasma generated by using the radial line slot antenna, the electron temperature is not substantially dependent on the distance from the bottom surface of the dielectric window except a region just below the dielectric window, as a general characteristic. Thus, the plasma processing may be performed at a relatively low electron temperature.

In the case of the plasma generated by inductive coupling, the electron density is increased as the distance from the bottom surface of the dielectric window becomes longer, and reaches a peak when the distance from the bottom surface is 50 mm. Then, the electron density is gradually decreased as the distance from the bottom surface of the dielectric window is increased. In contrast, in the case of the microwave plasma generated by using the radial line slot antenna, the electron density is gradually decreased as the distance from the bottom surface of the dielectric window is increased. In the case of the microwave plasma generated by using the radial line slot antenna, it may be understood that the plasma generated in the vicinity of the bottom surface of the dielectric window is gradually diffused within the processing container. Accordingly, in the case of the microwave plasma generated by using the radial line slot antenna, the plasma processing may be performed by adjusting the distance from the bottom surface of the dielectric window according to a required processing efficiency. In the range of up to 150 mm, the microwave plasma generated by using the radial line slot antenna has an electron density of at least about $2.0 \times 10^{11}$ cm$^{-3}$ which is a level free from problems in performing an efficient processing.

Figure 7:
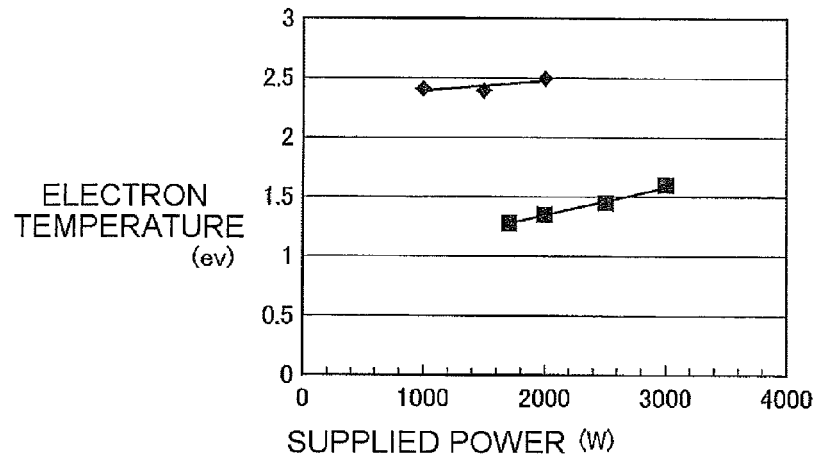
FIG. 7 is a graph representing a relationship between a supplied power (W) and an electron temperature (eV) in a case where microwave plasma is generated by using a radial line slot antenna.
Figure 8:
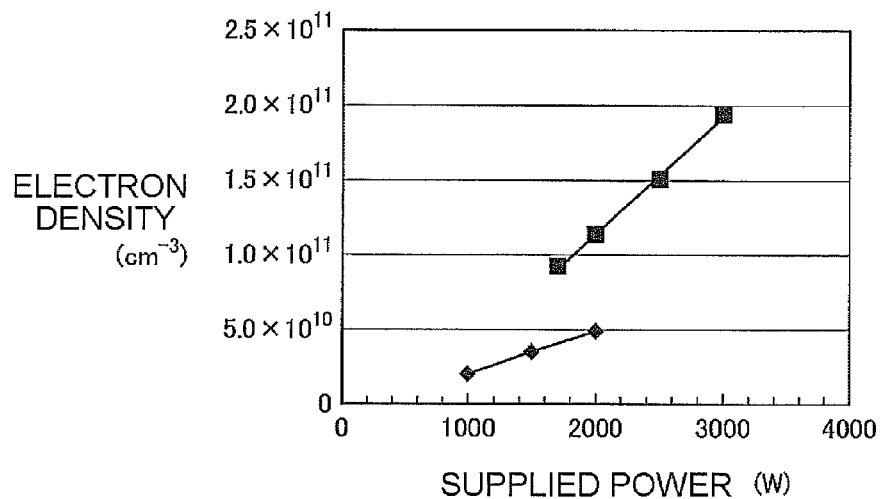
FIG. 8 is a graph representing a relationship between a supplied power (W) and an electron density (cm$^{-3}$) in a case where plasma is generated by inductive coupling.

FIG. 7 is a graph representing a relationship between a supplied power (W) and an electron temperature (eV) in a case where microwave plasma is generated by using a radial line slot antenna, and in a case where plasma is generated by inductive coupling. The vertical axis represents an electron temperature (eV), and the horizontal axis represents a supplied power (W). FIG. 8 is a graph representing a relationship between a supplied power (W) and an electron density (cm$^{-3}$) in a case where microwave plasma generated by using a radial line slot antenna, and in a case of plasma generated by inductive coupling. The vertical axis represents an electron density (cm$^{-3}$), and the horizontal axis represents a supplied power (W). Also, for these measurements, a Langmuir probe method is employed, and a probe is positioned at a position of 100 mm downward from the bottom surface of the dielectric window to carry out measurement. As for the process conditions, N$_2$ gas is used and the pressure is set to 20 mTorr.

Referring to FIGS. 7 and 8, the electron temperature of the microwave plasma generated by using the radial line slot antenna is lower than the electron temperature of the plasma generated by inductive coupling. Specifically, in the case of the microwave plasma generated by using the radial line slot antenna, when the supplied power changes from 1300 W to 3000 W, the electron temperature changes from about 1.3 eV to 1.6 eV. In contrast, in the case of the plasma generated by inductive coupling, when the supplied power changes from 700 W to 2000 W, the electron temperature changes from about 2.3 eV to 2.5 eV. That is, in the case of the plasma generated by inductive coupling, when any supplied power is applied, the electron temperature is not less than 2.0 eV. In contrast, in the case of the microwave plasma generated by using the radial line slot antenna, even when the supplied power is increased or decreased to some extent, the electron temperature is about 1.5 eV.

Meanwhile, both the electron density of the microwave plasma generated by using the radial line slot antenna and the electron density of the plasma generated by inductive coupling are increased as the value of the supplied microwave power is increased. However, at the same supplied power, the electron density of the microwave plasma generated by using the radial line slot antenna is higher than the electron density of the plasma generated by inductive coupling. For example, when a power of 2000 W is supplied, the electron density of the plasma generated by inductive coupling is about $5.0 \times 10^{10}$ ($cm^{-3}$) while the electron density of the microwave plasma generated by using the radial line slot antenna is about $1.2 \times 10^{11}$ ($cm^{-3}$).

Hereinafter, descriptions will be made on damage to a silicon substrate at the time of plasma processing. At the time of plasma processing, it is considered that a reaction system in an interface between the silicon substrate and another layer is the same in both doping and etching. Here, the descriptions will be made with reference to the case of etching using plasma generated by inductive coupling, and the case of etching using microwave plasma generated by using the radial line slot antenna.

Figure 9:
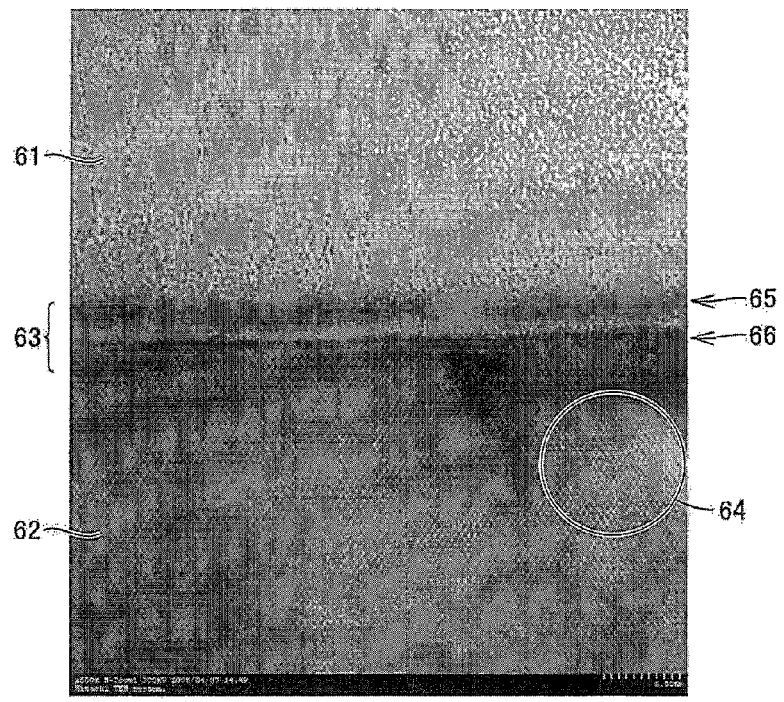
FIG. 9 is an enlarged transmission electron microscopic (TEM) photograph illustrating a portion of a silicon substrate when etching is performed using plasma generated by inductive coupling.
Figure 10:
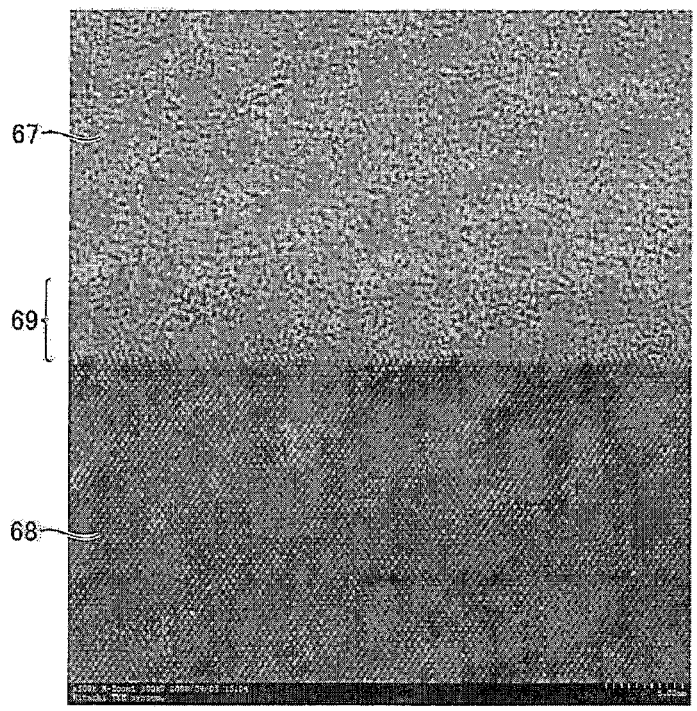
FIG. 10 is an enlarged TEM photograph illustrating a portion of a silicon substrate when etching is performed using microwave plasma generated by using a radial line slot antenna.

FIG. 9 is a TEM photograph illustrating a portion of a silicon substrate when etching is performed using plasma generated by inductive coupling. FIG. 10 is an enlarged TEM photograph illustrating a portion of a silicon substrate when etching is performed using microwave plasma generated by using a radial line slot antenna. In FIGS. 9 and 10, the top layer is a carbon layer 61, the bottom layer is a silicon substrate 62, and an oxide film layer 63 interposed between the carbon layer 61 and the silicon substrate 62 is an etched region.

Referring to FIG. 9, when etching is performed using the plasma generated by inductive coupling, some crystal defects are shown in the silicon substrate 62 as indicated in a region 64. Further, at the silicon substrate 62 side and the carbon layer 61 side, layers damaged by the plasma are formed as indicated in regions 65 and 66, respectively. That is, it is understood that damage caused by the plasma occurs. From the TEM photograph illustrated in FIG. 9, it is assumed that damage caused by the plasma occurs in the doping using the plasma generated by inductive coupling in the same manner as in the etching using the plasma generated by inductive coupling.

In contrast, referring to FIG. 10, when etching is performed using the microwave plasma generated by using the radial line slot antenna, no crystal defects and no damage layers are shown in a carbon layer 67, a silicon substrate 68, and an oxide film layer 69. That is, it is understood that damage caused by the plasma does not occur. From the TEM photograph illustrated in FIG. 10, it is assumed that damage caused by the plasma does not occur in the doping through the microwave plasma generated by using the radial line slot antenna in the same manner as in the etching through the microwave plasma generated by using the radial line slot antenna.

Figure 11:
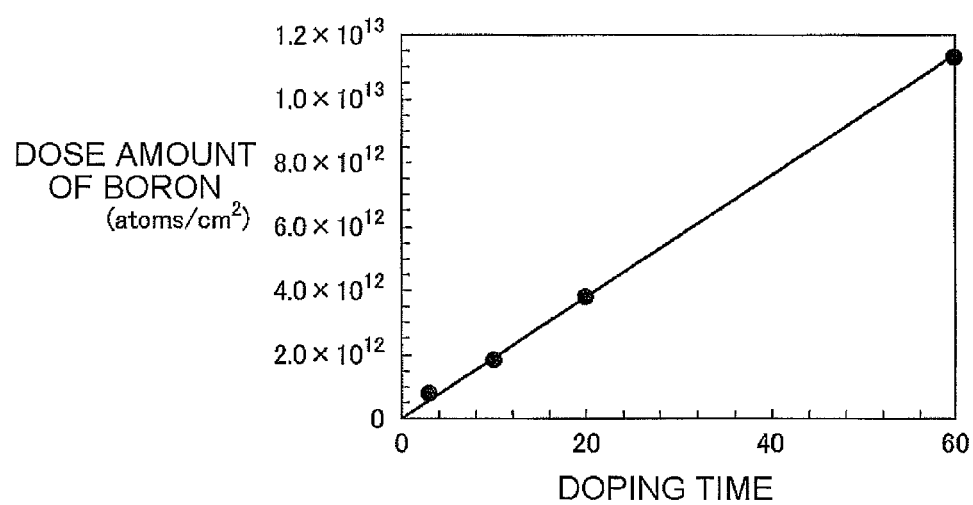
FIG. 11 is a graph representing a relationship between a dose amount of boron and a doping time when doping is performed by microwave plasma generated by using a radial line slot antenna, in which bias power is not applied.
Figure 12:
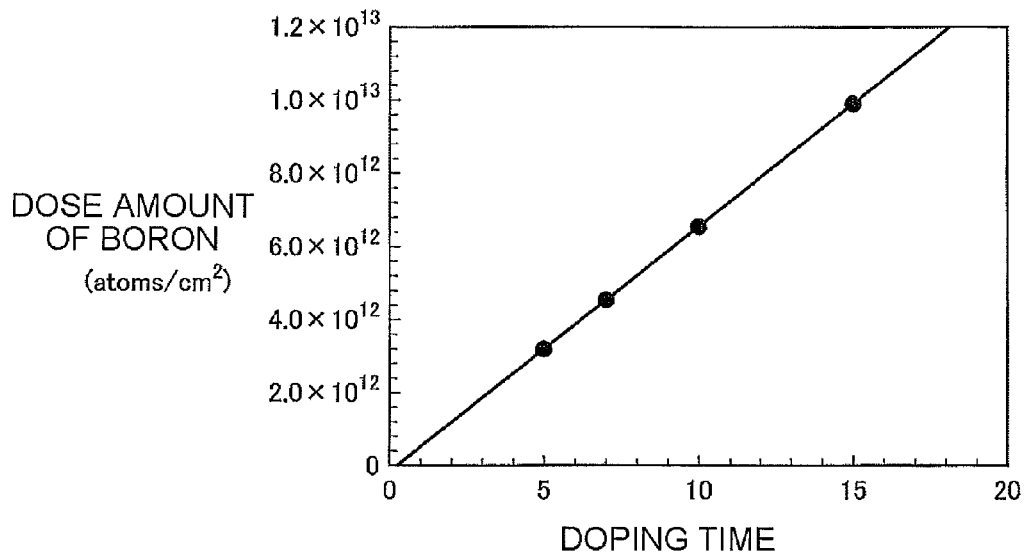
FIG. 12 is a graph representing a relationship between a dose amount of boron and a doping time when doping is performed by microwave plasma generated by using a radial line slot antenna, in which bias power of 600 W is applied.

Here, graphs representing the relationship between a dose amount of boron and a doping time when doping is performed by microwave plasma generated by using a radial line slot antenna are illustrated in FIGS. 11 and 12. In each of FIGS. 11 and 12, the vertical axis represents a dose amount (atoms/$cm^2$) of boron, and the horizontal axis represents a doping time (sec). The process conditions in the case illustrated in FIG. 11 are as follows: the pressure is 150 mTorr, the flow rate ratio of mixed gas (content of $B_2H_6$ is 0.7% of $H_2$) to He gas is 1 sccm: 999 sccm, the supplied power is 3 kW, the supply ratio of the first gas supply unit (center gas) to the second gas supply unit (edge gas) is 20:80, and the bias power is 0 W, that is, no bias power is applied. The process conditions in the case illustrated in FIG. 12 are as follows: the pressure is 60 mTorr, the flow rate ratio of mixed gas (content of $B_2H_6$ is 0.7% of $H_2$): He gas is 0.5 sccm: 499 sccm, the supplied power is 3 kW, the supply ratio of the first gas supply unit (center gas) to the second gas supply unit (edge gas) is 30:70, and the bias power is 600 W. The measurement of the dose amount is performed by a secondary ion-microprobe mass spectrometer (SIMS) in both cases. The value of the dose amount is a value at a central portion of a disk-shaped substrate W with a diameter of 300 mm, that is, at the center of the substrate W.

Referring to FIG. 11, in the case where no bias power is applied, even when the doping time is 20 seconds, the dose amount is about $4.0 \times 10^{12}$ (atoms/$cm^2$), and when the doping time reaches 60 seconds, the dose amount is about $1.1 \times 10^{13}$ (atoms/$cm^2$). That is, by selecting the doping time in a range of 60 seconds or less, doping at a low concentration, specifically doping in the order of $1.0 \times 10^{12}$ (atoms/$cm^2$) may be performed.

Referring to FIG. 12, in the case where the bias power of 600 W is applied, when the doping time is 5 seconds, the dose amount is about $3.3 \times 10^{12}$ (atoms/$cm^2$), and when the doping time reaches 16 seconds, the dose amount is about $9.7 \times 10^{12}$ (atoms/$cm^2$). That is, in the case where the bias power of 600 W is applied, by selecting the doping time in a range of 16 seconds or less, doping in the order of $1.0 \times 10^{12}$ (atoms/$cm^2$) may be performed.

Hereinafter, in-plane uniformity by doping will be described. In the case illustrated in FIG. 12, a dose amount at an end portion of the disk-shaped substrate W was measured in the same manner as described above, that is, in the same manner as at the central portion of the substrate W, at a position 145 mm away from the center of the substrate W that has been subjected to doping by the microwave plasma generated by using the radial line slot antenna.

When the doping time is 10 seconds, the dose amount at the central portion was $6.04 \times 10^{12}$ ($cm^{-3}$), and the dose amount at the end portion 145 mm away from the center of the substrate W was $5.29 \times 10^{12}$ ($cm^{-3}$). When the doping time was 16 seconds, the dose amount at the central portion was $9.67 \times 10^{12}$ ($cm^{-3}$), and the dose amount at the end portion 145 mm away from the center of the substrate W was $8.09 \times 10^{12}$ ($cm^{-3}$). That is, there is little difference in the dose amount between the central portion and the end portion of the substrate W. Accordingly, it may be understood that high in-plane uniformity in the doping is achieved by the microwave plasma generated by using the radial line slot antenna.

Figure 13:
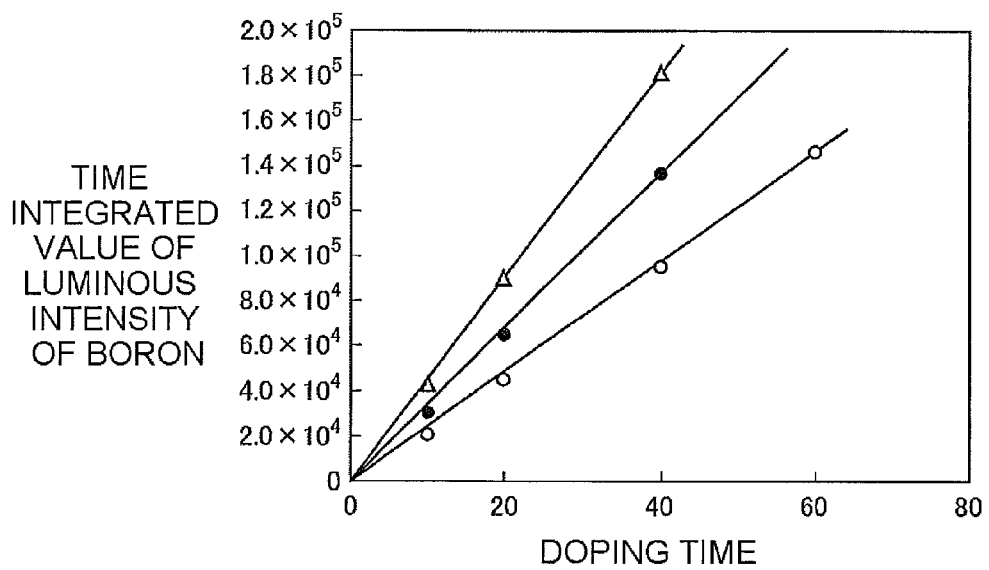
FIG. 13 is a graph representing a relationship between a time integrated value of luminous intensity of boron within a processing container, and a doping time when doping is performed by microwave plasma generated by using a radial line slot antenna.

FIG. 13 illustrates a graph representing the relationship between a time integrated value of luminous intensity of boron within the processing container and a doping time when doping is performed by microwave plasma generated by using a radial line slot antenna. In FIG. 13, the vertical axis represents a time integrated value of luminous intensity of boron, and the horizontal axis represents a doping time (sec). Time integrated values of luminous intensity of boron were measured by optical emission spectroscopy (OES). That is, the time integrated values were obtained by measuring emission peak values of 249 nm to 250 nm that exhibit light emission of boron, and by integrating the values over time. The OES measurement was performed in real time by inserting a measuring device into the processing container 32. In FIG. 13, the white circles indicate that the flow rate ratio of $B_2H_6/H_2$ of a mixed gas supplied as a doping gas with respect to Ar is 1 sccm, the black circles indicate that the flow rate ratio of $B_2H_6/H_2$ with respect to Ar is 2 sccm, and the white triangles indicate that the flow rate ratio of $B_2H_6/H_2$ with respect to Ar is 3 sccm.

Referring to FIG. 13, it may be seen that in all the flow rate ratios, there is a substantially proportional relationship between the time integrated value of the luminous intensity of boron and the doping time. That is, it may be seen that as the doping time is elapsed, the time integrated value of the luminous intensity of boron is linearly increased. Further, it may be understood that as the flow rate ratio of the mixed gas, that is, $B_2H_6/H_2$ gas increases, the time integrated value of the luminous intensity of boron is increased within a short time. Accordingly, when doping is performed by the microwave plasma generated by using the radial line slot antenna, the dose amount may be controlled to some extent by managing the doping time. That is, the concentration of dopant may be controlled by adjusting the doping time.

Figure 14:
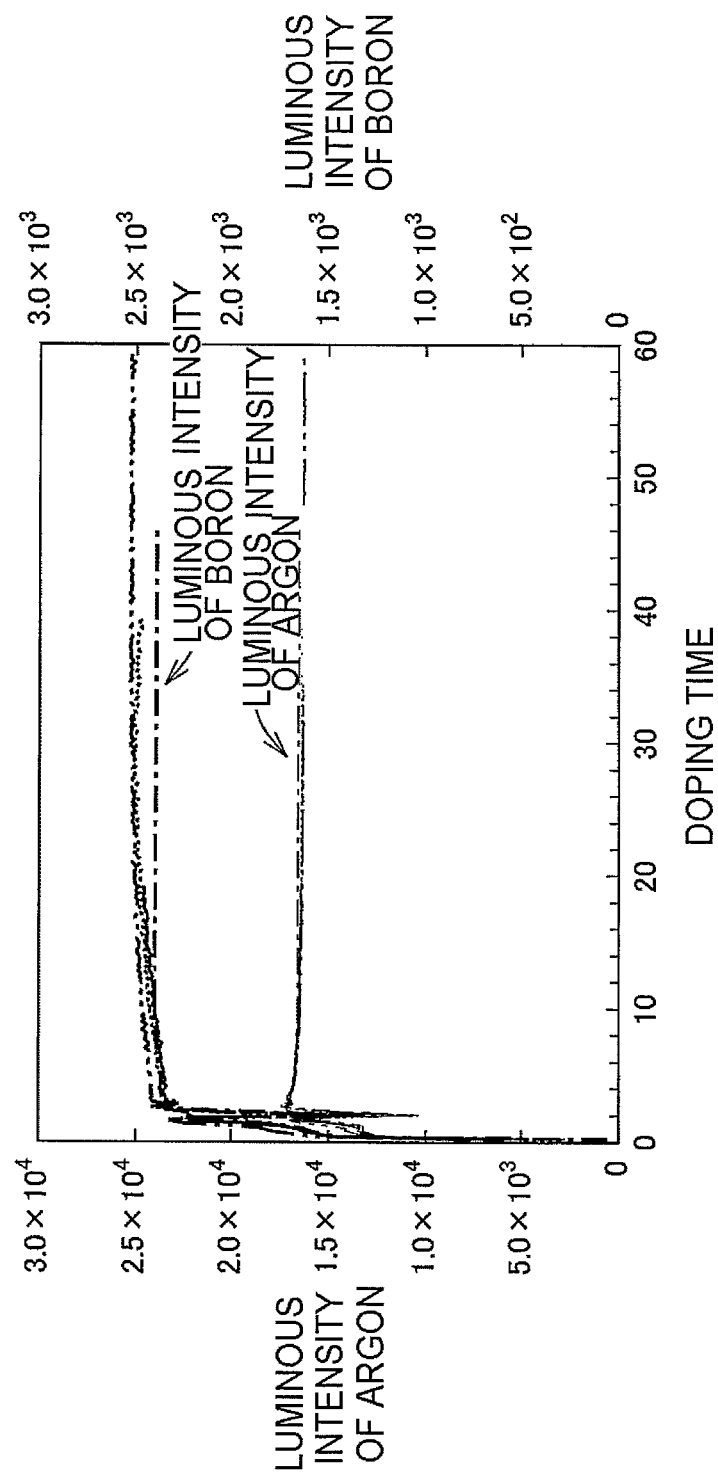
FIG. 14 is a graph representing a relationship between a doping time and luminous intensity of argon, and a relationship between a doping time and luminous intensity of boron when doping is performed by microwave plasma generated by using a radial line slot antenna.

FIG. 14 illustrates a graph representing the relationship between a doping time and luminous intensity of argon as well as the relationship between a doping time and luminous intensity of boron when doping is performed by microwave plasma generated by using a radial line slot antenna. In FIG. 14, the left vertical axis represents luminous intensity of argon, the right vertical axis represents luminous intensity of boron, and the horizontal axis represents a doping time (sec). When measuring the luminous intensity, OES analysis is performed. The process conditions are as follows: the pressure is 150 mTorr, the flow rate ratio of mixed gas (content of $B_2H_6$ is 0.7% of $H_2$) to Ar gas is 2 sccm: 998 sccm, the supply ratio of the first gas supply unit (center gas) to the second gas supply unit (edge gas) is 20:80, the supplied power is 3 kW, and the bias power is 0 W (that is, no bias power is applied). The peak at 404.4 nm is used as a representative reference peak of luminous intensity of argon. In FIG. 14, plotting is made for each of 10 sec, 20 sec, 40 sec, and 60 sec. In FIG. 14, the value indicated on the left vertical axis which is less than $2.0 \times 10^4$ after 10 sec represents a value at 404.4 nm, that is, the representative peak of luminous intensity of argon, in which the thin solid line, the thin dotted line, the thin one-dot chain line, and the thin two-dot chain line indicated in this order from the top represent the cases in which the time is 10 sec, 20 sec, 40 sec, and 60 sec, respectively. In FIG. 14, the value indicated on the right vertical axis which is $2.0 \times 10^3$ or more after 10 sec represents a value at 249.8 nm, that is, the representative peak of luminous intensity of boron, in which the thick solid line, the thick dotted line, the thick one-dot chain line, and the thick two-dot chain line indicated in this order from the top represent the cases in which the time is 10 sec, 20 sec, 40 sec, and 60 sec, respectively.

Referring to FIG. 14, in both boron and argon, the luminous intensity is increased when plasma is generated, reaches a substantially maximum at about 3 sec, and then becomes a constant value until 60 sec. This phenomenon may be described as follows. That is, for example, in the plasma generated by inductive coupling, the luminous intensity values of boron and argon within the processing container measured by OES measurement are not stabilized and rather have a tendency to be unstably increased with elapse of time. This is because the process gas components adsorbed to the inner wall of the processing container are released as an excitation gas again in the plasma by plasma irradiation when the plasma is not stabilized or many high energy ions in the plasma are irradiated into the processing container. However, in the microwave plasma generated by using the radial line slot antenna, the values do not have such a tendency to be unstably increased. Thus, it may be understood that the plasma is stably generated within the processing container.

Figure 15:
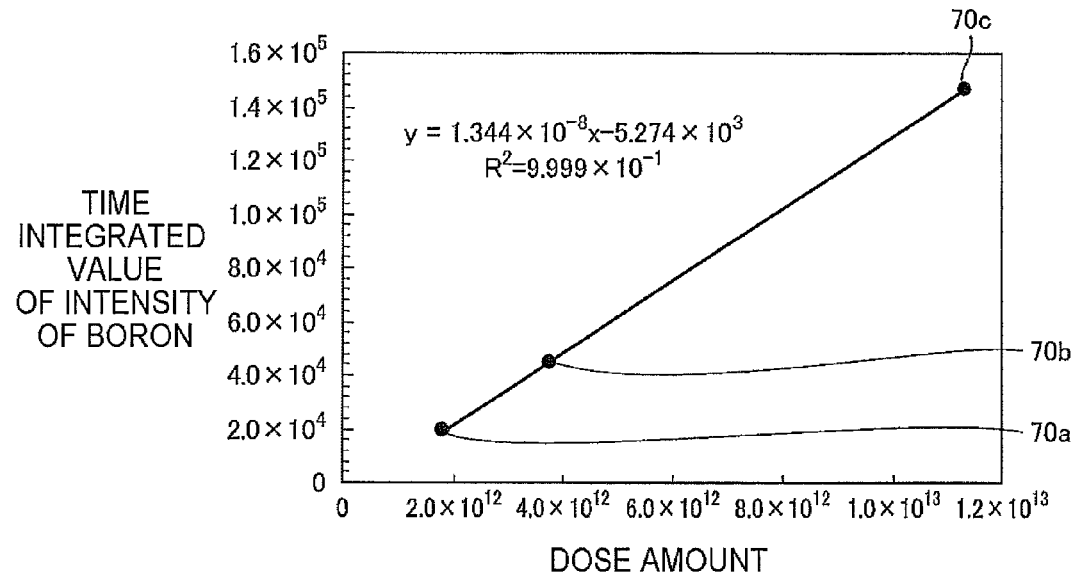
FIG. 15 is a graph representing a relationship between an integrated value of luminous intensity of boron, and a dose amount of boron.
Figure 16:
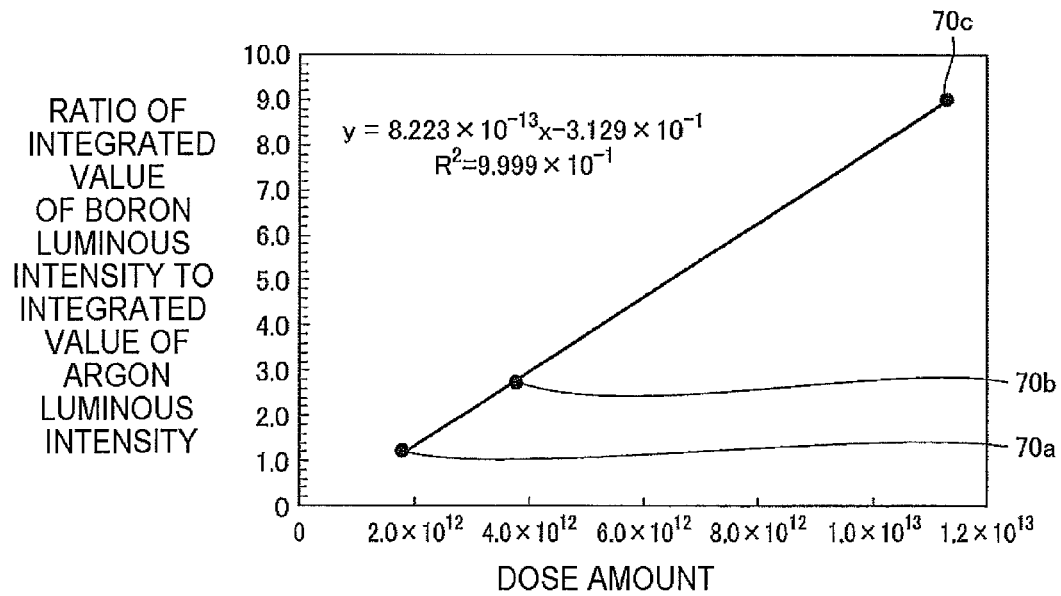
FIG. 16 is a graph representing a relationship between a ratio of an integrated value of luminous intensity of boron to an integrated value of luminous intensity of argon, and a dose amount of boron.

FIG. 15 is a graph representing the relationship between an integrated value of luminous intensity of boron and a dose amount of boron. In FIG. 15, the vertical axis represents an integrated value of luminous intensity of boron, and the horizontal axis represents a dose amount of boron (atoms/cm²). The dose amount is measured by SIMS in both the case of FIG. 15 and the case illustrated in FIG. 16 to be described later. In FIG. 15 and FIG. 16 to be described later, points 70a, 70b and 70c represent cases in which a doping time is 10 sec, 20 sec, and 40 sec, respectively.

Referring to FIG. 15, it may be seen that there is a substantially proportional relationship between the integrated value of the luminous intensity of boron and the dose amount of boron. That is, it may be understood that there is a linearly increased correlation because the time integrated value of the luminous intensity of boron is increased as the dose amount is increased.

The ratio of the integrated value of the luminous intensity of boron to the integrated value of the luminous intensity of argon, that is, the integrated value of the luminous intensity of boron which is standardized as the integrated value of the luminous intensity of argon is as follows. FIG. 16 is a graph representing a relationship between a ratio of an integrated value of luminous intensity of boron to an integrated value of luminous intensity of argon and a dose amount of boron. In FIG. 16, the vertical axis represents a ratio of an integrated value of luminous intensity of boron in relation to an integrated value of luminous intensity of argon, and the horizontal axis represents a dose amount (atoms/cm²) of boron.

Referring to FIG. 16, it may be seen that there is a substantially proportional relationship between the ratio of the integrated value of luminous intensity of boron to the integrated value of luminous intensity of argon, and the dose amount of boron. That is, in the same manner as in the case of the luminous intensity of boron, it may be seen that there is a linearly increased correlation because the ratio of the integrated value of luminous intensity of boron to the integrated value of luminous intensity of argon is increased as the dose amount is increased. This standardized value may be effectively used in the following cases. In the above described cases, at the time of performing doping on the substrate W by the microwave plasma generated by using the radial line slot antenna, when the bias power is not applied, the luminous intensity of silicon as an element is at an almost ignorable level, and the wavelength of silicon is largely different from the wavelength of boron. However, when the bias power is applied, the luminous intensity of silicon is increased, and thus the wavelength of the luminous intensity of silicon overlaps the wavelength of the luminous intensity of boron. In this case, it is believed that, when the value standardized by the integrated value of luminous intensity of argon is used, the influence of silicon may be reduced and thus, the dose amount may be adjusted more exactly.

Based on, for example, the correlation between the luminous intensity of boron and the dose amount, the plasma doping apparatus 31 may be provided with a dose amount measuring mechanism configured to measure a dose amount of dopant implanted into the substrate W, and the control unit 28 may perform a control such that the doping on the substrate W is stopped when the dose amount measuring mechanism determines that the dose amount of the dopant implanted into substrate W has reached a required amount.

In this case, the dose amount measuring mechanism configured to measure the dose amount may include a luminous intensity measuring apparatus configured to measure the luminous intensity of an element within the processing container 32, for example, boron or argon. In this case, the dose amount measuring mechanism is configured to determine that the dose amount of dopant has reached a required value based on the luminous intensity of the element within the processing container 32 which is measured by the luminous intensity measuring apparatus. The plasma doping method may include the step of stopping the doping on the substrate W when it is determined that the dose amount of the dopant implanted into the substrate W has reached a required amount at the time of measuring the dose amount of the dopant implanted into the substrate W.

Here, the dose amount (atoms/cm$^2$) is calculated by flux (atoms/sec·cm$^2$) of boron included in a doping gas multiplied by doping time (sec). However, the dose amount is calculated by a constant k (a divided value of dose/integrated value of luminous intensity) multiplied by luminous intensity of boron and doping time (sec).

The measurement of the dose amount of the dopant is not limited to the measurement of the luminous intensity of an element, but other methods may be used.

The present disclosure is not limited to the case of requiring doping of a low concentration such as a dopant concentration less than $1 \times 10^{13}$ atoms/cm$^2$. When doping is performed by microwave plasma generated by using the radial line slot antenna, the dose amount in the doping may be easily close to a required value, in the following.

Figure 17:
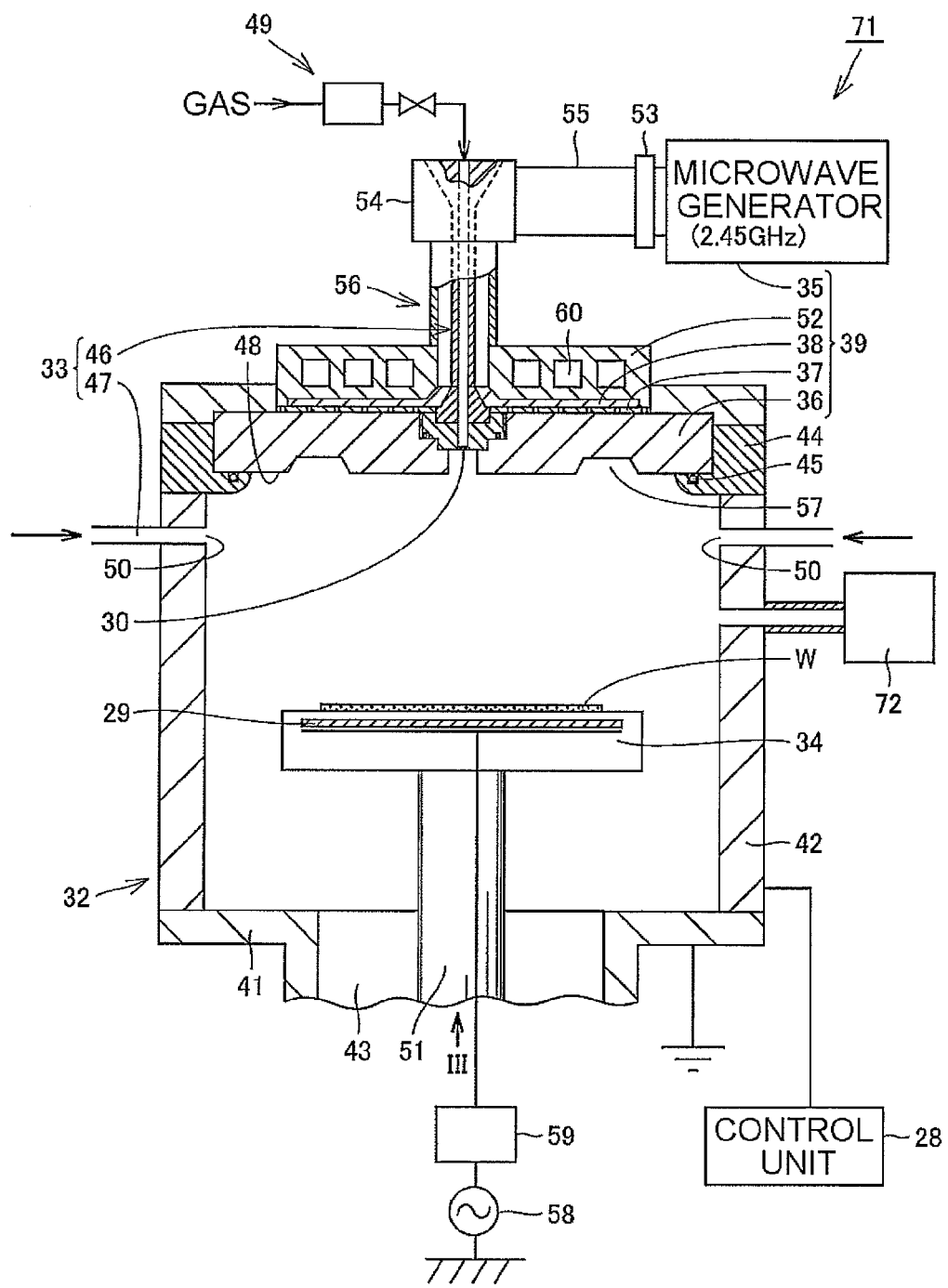
FIG. 17 is a schematic cross-sectional view illustrating a main part of a plasma doping apparatus according to another exemplary embodiment of the present disclosure.

FIG. 17 is a schematic cross-sectional view illustrating a main part of a plasma doping apparatus according to another exemplary embodiment of the present disclosure. FIG. 17 corresponds to a cross-section illustrated in FIG. 2. In a plasma doping apparatus 71 illustrated in FIG. 17, the same elements as those of the plasma doping apparatus 31 illustrated in FIG. 2 are given the same reference numerals, and the descriptions thereof will be omitted.

Referring to FIG. 17, the plasma doping apparatus 71 is provided with a luminous intensity measuring apparatus 72 which has a probe (not illustrated) capable of being disposed within a processing container 32, and is configured to measure luminous intensity of an element existing within the processing container 32. The luminous intensity measuring apparatus 72 may measure an integrated value of luminous intensity of an element existing within the processing container 32, the integrated value being accumulated with elapse of time.

That is, the plasma doping apparatus 71 according to another exemplary embodiment of the present disclosure is provided with the processing container 32 configured to implant dopant into a substrate W therein, a gas supply unit 33 configured to supply a doping gas or an inert gas for plasma excitation into the processing container 32, a holding unit 34 which is disposed within the processing container 32 and configured to hold the substrate W thereon, a plasma generating mechanism 39 configured to generate plasma within the processing container 32 by using microwave, a pressure control mechanism configured to control the pressure within the processing container 32, the luminous intensity measuring apparatus (dose amount measuring mechanism) 72 configured to measure a dose amount of a dopant implanted into the substrate W, and a control unit 28 configured to control the plasma doping apparatus 71. The plasma generating mechanism 39 includes a microwave generator 35 configured to generate microwave for plasma excitation, a dielectric window 36 configured to transmit the microwave generated by the microwave generator 35 into the processing container 32, and a radial line slot antenna 37 which is formed with a plurality of slots 40 and configured to radiate the microwave to the dielectric window 36. The control unit 28 performs a control such that the doping gas and the gas for plasma excitation are supplied into the processing container 32 by the gas supply unit 33 in a state where the substrate W is placed on the holding unit 34, and then plasma is generated by the plasma generating mechanism 39 to perform doping on the substrate W, and the doping is stopped when the dose amount measured by the luminous intensity measuring apparatus (dose amount measuring mechanism) 72 has reached a predetermined value.

The plasma doping method according to another exemplary embodiment of the present disclosure includes a step of holding the substrate W on the holding unit 34 disposed within the processing container 32, a gas supply step of supplying a doping gas and a gas for plasma excitation into the processing container 32, a doping step of generating plasma within the processing container 32 by using the microwave generator 35, the dielectric window 36, and the radial line slot antenna 37, to perform doping on the substrate W, and a dose amount measuring step of measuring a dose amount of dopant that is implanted into the substrate W by the doping step. The microwave generator 35 is configured to generate microwave for plasma excitation within the processing container 32, the dielectric window 36 is configured to transmit the microwave generated by the microwave generator 35 into the processing container 32, and the radial line slot antenna 37 which is formed with the plurality of slots 40 and configured to radiate the microwave to the dielectric window 36.

Through the plasma doping apparatus, stable doping may be performed on the substrate, in-plane uniformity of a dose amount on the substrate may be improved, and doping of any dose amount may be performed more accurately.

In the above described exemplary embodiments, the semiconductor device manufactured by the plasma doping method and the plasma doping apparatus is a FinFET type semiconductor device. However the present disclosure is not limited thereto. For example, the method and apparatus are also effectively used in doping when an MOS type semiconductor device is manufactured.

In the above described exemplary embodiments, $B_2H_6$ is used as a doping gas, but the present disclosure is not limited thereto. For example, $BF_3$ may be used. That is, the doping gas may include at least one of $B_2H_6$ and $BF_3$. When doping of other elements such as arsenic, phosphorous, or fluorine, as a dopant is performed, the doping gas may include at least one kind of gas selected from a group including $PH_3$, $AsH_3$, $GeH_4$, $CH_4$, $NH_3$, $NF_3$, $N_2$, HF and $SiH_4$.

In the above described exemplary embodiments, as for an inert gas for plasma excitation, He is used, but the present disclosure is not limited thereto. For example, the gas may include at least one kind of gas selected from a group including He, Ne, Ar, Kr, and Xe.

In the above described exemplary embodiments, as for the substrate, a silicon substrate is used, but the present disclosure is non limited thereto. For example, the present disclosure may be sufficiently applied to doping on an interlayer film.

In the above described exemplary embodiments, the plasma doping apparatus includes a dielectric member, but the present disclosure is not limited thereto. The apparatus may not include the dielectric member.

As described above, exemplary embodiments of the present disclosure have been described with reference to drawings, but the present disclosure is not limited to the illustrated exemplary embodiments. In the illustrated exemplary embodiments, various modifications and changes may be made within the scope of the present disclosure or equivalents thereof.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma doping method of performing doping by implanting a dopant into a substrate to be processed, the method comprising:
holding the substrate on a holding unit disposed within a processing container;
supplying a doping gas and a gas for plasma excitation into the processing container; and
performing doping on the substrate such that the concentration of the dopant implanted into the substrate is less than $1 \times 10^{13}$ atoms/cm² by generating plasma within the processing container by using a microwave generator configured to generate microwave for plasma excitation within the processing container, a dielectric window configured to transmit the microwave generated by the microwave generator into the processing container, and a radial line slot antenna formed with a plurality of slots and configured to radiate the microwave to the dielectric window.

2. The method of claim 1, further comprising
stopping the doping on the substrate when it is determined that a dose amount of the dopant implanted into the substrate has reached a required amount at the time of measuring the dose amount of the dopant implanted into the substrate.

3. The method of claim 2, wherein in the stopping, a luminous intensity of an element within the processing container is measured, and it is determined that the dose amount of the dopant has reached the required amount based on the measured luminous intensity of the element within the processing container.

4. A plasma doping method of performing doping by implanting a dopant into a substrate to be processed, the method comprising:
holding the substrate on a holding unit disposed within a processing container;
supplying a doping gas and a gas for plasma excitation into the processing container;
performing doping on the substrate by generating plasma within the processing container by using a microwave generator configured to generate microwave for plasma excitation within the processing container, a dielectric window configured to transmit the microwave generated by the microwave generator into the processing container, and a radial line slot antenna formed with a plurality of slots and configured to radiate the microwave to the dielectric window; and
measuring a dose amount of the dopant implanted into the substrate by the doping.

5. The method of claim 4, wherein in the measuring the dose amount, the dose amount is measured based on a measured luminous intensity of an element within the processing container.

6. The method of claim 1, wherein the pressure within the processing container is set to be in a range of 100 mTorr to 150 mTorr so as to perform the doping.

7. The method of claim 1, wherein the gas for plasma excitation includes at least one of He and Ar.

8. The method of claim 1, wherein the doping gas includes at least one of $B_2H_6$ and $BF_3$.

9. A plasma doping apparatus that performs doping by implanting a dopant into a substrate to be processed, the plasma doping apparatus comprising:
a processing container configured to implant the dopant into the substrate therein;
a gas supply unit configured to supply a doping gas and an inert gas for plasma excitation into the processing container;
a holding unit disposed within the processing container and configured to hold the substrate thereon;
a plasma generating mechanism configured to generate plasma within the processing container by using microwave;
a pressure control mechanism configured to control pressure within the processing container; and
a control unit configured to control the plasma doping apparatus,
wherein the plasma generating mechanism includes a microwave generator configured to generate microwave for plasma excitation, a dielectric window configured to transmit the microwave generated by the microwave generator into the processing container, and a radial line slot antenna formed with a plurality of slots and configured to radiate the microwave to the dielectric window, and
the control unit performs a control such that the doping gas and the gas for plasma excitation are supplied into the processing container by the gas supply unit in a state where the substrate is placed on the holding unit, and then the plasma is generated by the plasma generating mechanism to perform the doping on the substrate such that the concentration of the dopant implanted into the substrate is less than $1 \times 10^{13}$ atoms/cm².

10. The plasma doping apparatus of claim 9, further comprising a dose amount measuring mechanism configured to measure a dose amount of the dopant implanted into the substrate,
wherein the control unit performs a control such that the doping on the substrate is stopped when the dose amount measuring mechanism determines that the dose amount of the dopant implanted into the substrate has reached a required amount.

11. The plasma doping apparatus of claim 10, wherein the dose amount measuring mechanism includes a luminous intensity measuring apparatus configured to measure a luminous intensity of an element within the processing container, the does amount mechanism being configured to determine that the dose amount of the dopant has reached the required amount based on the luminous intensity of the element within the processing container which is measured by the luminous intensity measuring apparatus.

12. A plasma doping apparatus that performs doping by implanting a dopant into a substrate to be processed, the plasma doping apparatus comprising:
a processing container configured to implant the dopant into the substrate therein;
a gas supply unit configured to supply a doping gas and an inert gas for plasma excitation into the processing container;
a holding unit disposed within the processing container and configured to hold the substrate thereon;
a plasma generating mechanism configured to generate plasma within the processing container by using microwave;
a pressure control mechanism configured to control pressure within the processing container;
a dose amount measuring mechanism configured to measure a dose amount of the dopant implanted into the substrate; and a control unit configured to control the plasma doping apparatus, wherein the plasma generating mechanism includes a microwave generator configured to generate microwave for plasma excitation, a dielectric window configured to transmit the microwave generated by the microwave generator into the processing container, and a radial line slot antenna formed with a plurality of slots and configured to radiate the microwave to the dielectric window, and the control unit performs a control such that the doping gas and the gas for plasma excitation are supplied into the processing container by the gas supply unit in a state where the substrate is placed on the holding unit, then the plasma is generated by the plasma generating mechanism to perform doping on the substrate, and the doping is stopped when the dose amount measured by the dose amount measuring mechanism has reached a predetermined value.

13. The plasma doping apparatus of claim 12, wherein the dose amount measuring mechanism includes a luminous intensity measuring apparatus configured to measure a luminous intensity of an element within the processing container.

14. The plasma doping apparatus of claim 9, wherein the control unit controls the pressure control mechanism such that the pressure within the processing container is set to be in a range of 100 mTorr to 150 mTorr so as to perform the doping.

15. The plasma doping apparatus of claim 9, wherein the gas for plasma excitation includes at least one of He and Ar.

16. The plasma doping apparatus of claim 9, wherein the doping gas includes at least one of $B_2H_6$ and $BF_3$.

* * * * *